United States Patent
Lee et al.

(10) Patent No.: US 7,304,898 B2
(45) Date of Patent: Dec. 4, 2007

(54) SEMICONDUCTOR MEMORY DEVICE

(75) Inventors: Chang-Hyuk Lee, Kyoungki-do (KR); Byoung-Jin Choi, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 41 days.

(21) Appl. No.: 11/322,948

(22) Filed: Dec. 30, 2005

(65) Prior Publication Data

US 2006/0245278 A1 Nov. 2, 2006

(30) Foreign Application Priority Data

Apr. 30, 2005 (KR) .................. 10-2005-0036584

(51) Int. Cl.
*G11C 7/00* (2006.01)

(52) U.S. Cl. .............. 365/193; 365/233; 365/189.05; 365/191; 365/194; 365/189.08

(58) Field of Classification Search ............... 365/193, 365/233, 191, 194, 189.05, 189.08
See application file for complete search history.

(56) References Cited

U.S. PATENT DOCUMENTS

| 5,892,730 | A | * | 4/1999 | Sato et al. ................. 365/233 |
| --- | --- | --- | --- | --- |
| 6,154,418 | A | | 11/2000 | Li |
| 6,381,180 | B1 | * | 4/2002 | Merritt et al. ......... 365/189.05 |
| 6,434,081 | B1 | * | 8/2002 | Johnson et al. ............. 365/233 |
| 6,525,971 | B2 | * | 2/2003 | Merritt et al. ......... 365/189.05 |
| 6,615,325 | B2 | * | 9/2003 | Mailloux et al. ............ 711/154 |
| 6,839,290 | B2 | | 1/2005 | Ahmad et al. |
| 6,909,643 | B2 | * | 6/2005 | Kwean ........................ 365/193 |
| 2004/0218460 | A1 | | 11/2004 | Lee |
| 2004/0268016 | A1 | | 12/2004 | Lee et al. |
| 2005/0105349 | A1 | | 5/2005 | Dahlberg et al. |

FOREIGN PATENT DOCUMENTS

JP 11328963 11/1999

\* cited by examiner

*Primary Examiner*—Viet Q. Nguyen
(74) *Attorney, Agent, or Firm*—Blakely, Sokoloff, Taylor & Zafman

(57) ABSTRACT

The present invention provides a semiconductor memory device for reducing a power consumption and securing an enough valid data window. A semiconductor memory device includes an align control signal generation unit for generating a plurality of align control signals sequentially activated by dividing a data strobe signal only when a data input/output is performed; and a data align unit for outputting a plurality of data which are sequentially inputted as a plurality of align data at the same time in response to the plurality of align control signals.

6 Claims, 9 Drawing Sheets

SEMICONDUCTOR MEMORY DEVICE

FIELD OF INVENTION

The present invention relates to a semiconductor memory device; and, more particularly, to a semiconductor memory device for reducing a power consumption due to data fetch.

DESCRIPTION OF RELATED ART

A semiconductor memory device has been continuously improved to increase its operational speed. One of methods to improve an operational speed of a semiconductor memory device is to make the semiconductor memory device operate in synchronization with an external clock signal. Therefore, a semiconductor memory device which operates in synchronization with the external clock signal, namely a synchronous semiconductor memory device, has been developed.

The synchronous semiconductor memory device performs a data access operation at a rising edge of the external clock signal. That is, the synchronous semiconductor memory device can perform the data access operation once within one cycle of the external clock signal.

Such a synchronous semiconductor memory device that performs the data access operation once within one cycle of the external clock signal is particularly called a single data rate (SDR) synchronous semiconductor memory device.

However, the SDR synchronous semiconductor memory device had to be more improved for use in a high speed system. Therefore, a double data rate (DDR) synchronous semiconductor memory device has been developed. The DDR synchronous semiconductor memory device performs the data access operation at a rising edge and a falling edge of the external clock signal. That is, the DDR synchronous semiconductor memory device performs the data access operation twice within one cycle of the external clock signal.

Since the DDR synchronous semiconductor memory device should perform the data access operation twice within one cycle of the external clock signal, a data access method used in the SDR synchronous semiconductor memory device can not be used in the DDR synchronous semiconductor memory device.

If a cycle of the external clock signal is 10 nano-seconds, the DDR synchronous semiconductor memory device has only about 6 nano-seconds for performing the data access operation because about 4 nano-seconds is spent for other operations such as raising and lowering edges of the external clock signal.

Since 6 nano-seconds is too short time for the DDR synchronous semiconductor memory device to internally handle a data at both edges of the external clock signal, the DDR synchronous semiconductor memory device performs a data access operation at both edges, i.e., a falling edge and a rising edge, of the external clock signal only when a data is inputted into or outputted from the DDR synchronous semiconductor memory device and, thus, the DDR synchronous semiconductor memory device internally performs the data access operation in synchronization with one of the both edges of the external clock signal.

Therefore, a new data access method is required for inputting a data into an internal core region and for outputting a data from the internal core region. For this purpose, a data input buffer of the DDR synchronous semiconductor memory device prefetches a 2-bit or 4-bit data synchronized with a rising edge or a falling edge in order to align the 2-bit or 4-bit data and, then, the aligned data is synchronized with a rising edge of a main clock as an even data or an odd data to be transferred to the internal core region.

Meanwhile, for an exact data input/output timing, when a data is inputted, a data strobe signal DQS is inputted with the data from a central processing unit (CPU) or a memory controller.

FIG. 1 is a block diagram showing a data align unit included in a conventional semiconductor memory device.

As shown, the data align unit includes a first, a third and a sixth flip-flops 10, 20 and 40 for latching input data DIN and DINB inputted in response to a rising data strobe signal DQSRP; and a second, a fourth, a fifth and a seventh flip-flops 15, 25, 35 and 45 for latching input data DIN and DINB inputted in response to a falling data strobe signal DQSFP. The first to the seventh flip-flops 10 to 45 are arranged in a form of 2-row and 4-column. Herein, the rising data strobe signal DQSRP is activated at a rising edge of a data strobe signal and the falling data strobe signal DQSFP is activated at a falling edge of the data strobe signal.

The data align unit further includes a first to a fourth drivers 52 to 58 for outputting each main output OUT of the second, the fourth, the fifth and the seventh flip-flops 15, 25, 35 and 45 as a first to a fourth align-data ALGN_DBR1, ALGN_DBR0, ALGN_DBF1 and ALGN_DBF0 respectively.

FIG. 2 is a schematic circuit diagram depicting the first flip-flop 10 shown in FIG. 1. Herein, each structure of the other flip-flops is same to that of the first flip-flop 10.

As shown, the first flip-flop 10 includes a differential amplifier 10 for receiving an input signal IN and an inverted input signal INB as a differential input in order to amplify the differential input; and an output driving unit 14 for driving a main output OUT and a sub output OUTB which respectively correspond to a first and a second signals of the differential amplifier 10.

The differential amplifier 10 is initialized at a falling edge of a clock CLK and amplifies a difference between the input signal IN and the inverted input signal INB to thereby output the amplified signal as the first and the second signals at a rising edge of the clock CLK. The output driving unit 14 is initialized in response to an activation of a power-up signal PWRUP in order to drive the main output OUT and the sub output OUTB which correspond to the first and the second signals, or, the input signal IN and the inverted signal INB, of the differential amplifier 10.

As shown in FIGS. 1 and 2, the above-mentioned flip-flops 10 to 45 receive the rising data strobe signal DQSRP or the falling data strobe signal DQSFP as the clock CLK and also receives data, i.e., the input signal IN and the inverted input signal INB, at a rising edge of the rising data strobe signal DQSRP or the falling data strobe signal DQSFP in order to output the main output OUT and the sub output OUTB.

FIG. 3 is a wave diagram showing an operation of the conventional semiconductor memory device shown in FIG. 1.

Referring to FIGS. 1 to 3, the operation of the conventional semiconductor memory device is described below.

A data DIN and an inverted data DINB are inputted in synchronization with a rising edge of the rising data strobe signal DQSRP and a rising edge of the falling data strobe signal DQSFP respectively. That is, the data DIN and the inverted data DINB are continuously inputted in synchronization with a rising edge and a falling edge of the data strobe signal respectively.

Thereafter, the first flip-flop 10 receives a data d0 in response to a first activation of the rising data strobe signal DQSRP to output the received data as the main output OUT and the sub output OUTB of the first flip-flop 10. The second flip-flop 15 receives the main output OUT and the sub output OUTB outputted from the first flip-flop 10 in response to a first activation of the falling data strobe signal DQSFP to output the received signals as the main output OUT and the sub output OUTB of the second flip-flop 15. Similarly, the fifth flip-flop 35 receives a data d1 in response to the first activation of the falling data strobe signal DQSFP to output the main output OUT and the sub output OUTB.

Accordingly, the first and the third drivers 52 and 56 drive main outputs of the second flip-flop 15 and the fifth flip-flop 35 in order to output the data d0 and d1 as the first align data ALGN_DBR1 and the third align data ALGN_DBF1 respectively at the same time.

Thereafter, the first flip-flop 10 receives a data d2 in response to an activation of the rising data strobe signal DQSRP to output the received data as the main output OUT and the sub output OUTB. Also, in response to the activation of the rising data strobe signal DQSRP, the third flip-flop 20 receives the main output OUT and the sub output OUTB outputted from the second flip-flop 15 in order to output the received signals as the main output OUT and the sub output OUTB of the third flip-flop 20 respectively. Likewise, in response to the activation of the rising data strobe signal DQSRP, the sixth flip-flop 40 receives the main output OUT and the sub output OUTB outputted from the fifth flip-flop 35 in order to output the received signals as the main output OUT and the sub output OUTB of the sixth flip-flop 40 respectively.

Thereafter, in response to an activation of the falling data strobe signal DQSFP, the second flip-flop 15 receives the main output OUT and the sub output OUTB of the first flip-flop 10 and the fifth flip-flop 35 latches and outputs a data d3; and, the fourth flip-flop 25 receives the main output OUT and the sub output OUTB outputted from the third flip-flop 20 and, likewise, the seventh flip-flop 45 receives the main output OUT and the sub output OUTB outputted from the sixth flip-flop 40.

Accordingly, the main outputs of the second, the fourth, the fifth and the seventh flip-flops 15, 25, 35 and 45 are outputted as the first to the fourth align data ALGN_DBR1 to ALGN_DBF0 by the first to the fourth drivers 52 to 58 respectively.

As shown in FIGS. 1 to 3, the first to the fourth data d0 to d3 which are sequentially inputted in synchronization with a rising edge and a falling edge of the data strobe signal after an activation of the data strobe signal and, then, the aligned data, i.e., first to the fourth align data ALGN_DBR1 to ALGN_DBF0, are outputted at the same time. Herein, when the first to the fourth align data ALGN_DBR1 to ALGN_DBF0 are outputted, an align data transfer signal DINCLK is activated in order to transfer the first to the fourth align data ALGN_DBR1 to ALGN_DBF0 to an IO sense amplifier for amplifying the transferred align data and delivering the amplified data to a unit memory cell.

Therefore, according to the conventional semiconductor memory device, a plurality of data sequentially inputted in synchronization with a rising edge and a falling edge of the data strobe signal are fetched by 4-bit.

Meanwhile, as described above, the flip-flops are continuously operated at each edge of the data strobe signal and, thus, a power is unnecessarily consumed. For instance, in case of a double data rate 2 synchronous dynamic random access memory (DDR2 SDRAM) based on a 10 μm-technology and 400 MHz of a data rate, the DDR2 SDRAM consumes a current of 1 mA for 1-bit data. Accordingly, for receiving 16-bit data, a current of 16 mA is consumed.

Further, according to the conventional semiconductor memory device, a valid data window is one clock. Therefore, a margin for a 0.5 clock, which is a valid data window according to a specification, is not enough.

SUMMARY OF INVENTION

It is, therefore, an object of the present invention to provide a semiconductor memory device for reducing a power consumption and for securing an enough valid data window.

In accordance with an aspect of the present invention, there is provided a semiconductor memory device, including: an align control signal generation unit for generating a plurality of align control signals sequentially activated by dividing a data strobe signal only when a data input/output is performed; and a data align unit for outputting a plurality of data which are sequentially inputted as a plurality of align data at the same time in response to the plurality of align control signals.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a semiconductor memory device in accordance with the present invention will be described in detail referring to the accompanying drawings.

Figure 1:
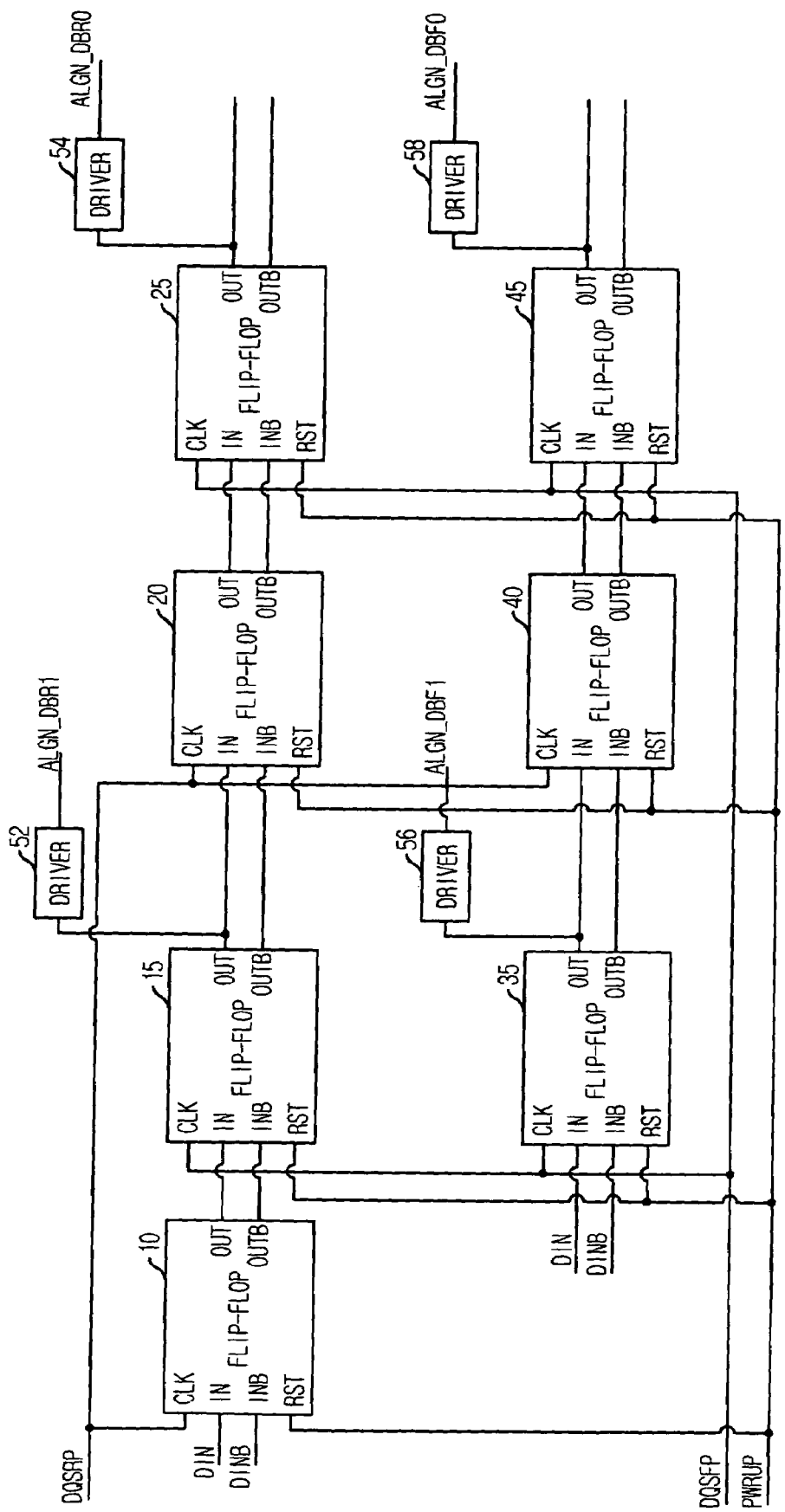
FIG. 1 is a block diagram showing a data align unit included in a conventional semiconductor memory device.
Figure 2:
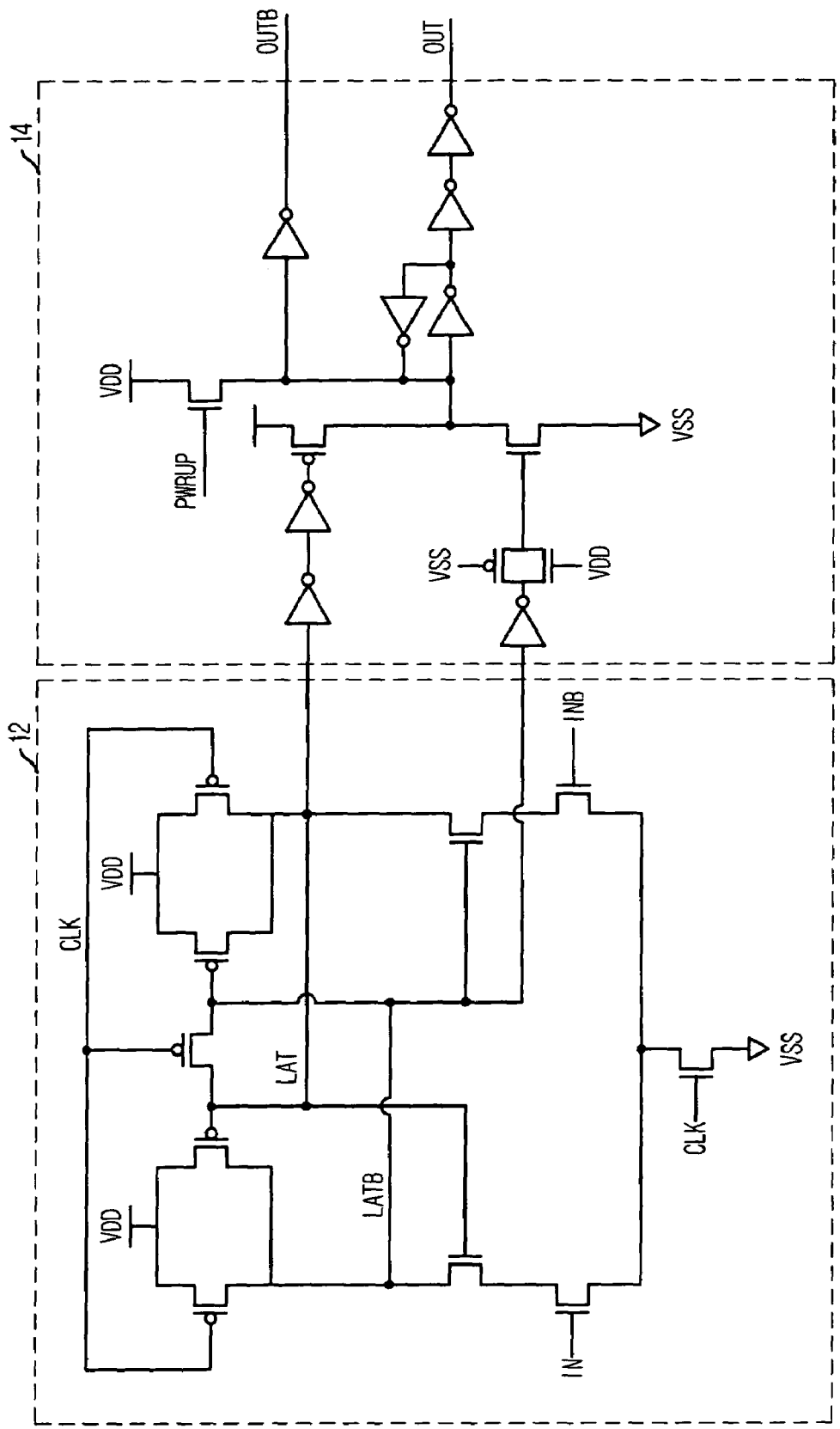
FIG. 2 is a schematic circuit diagram depicting the first flip-flop shown in FIG. 1.
Figure 3:
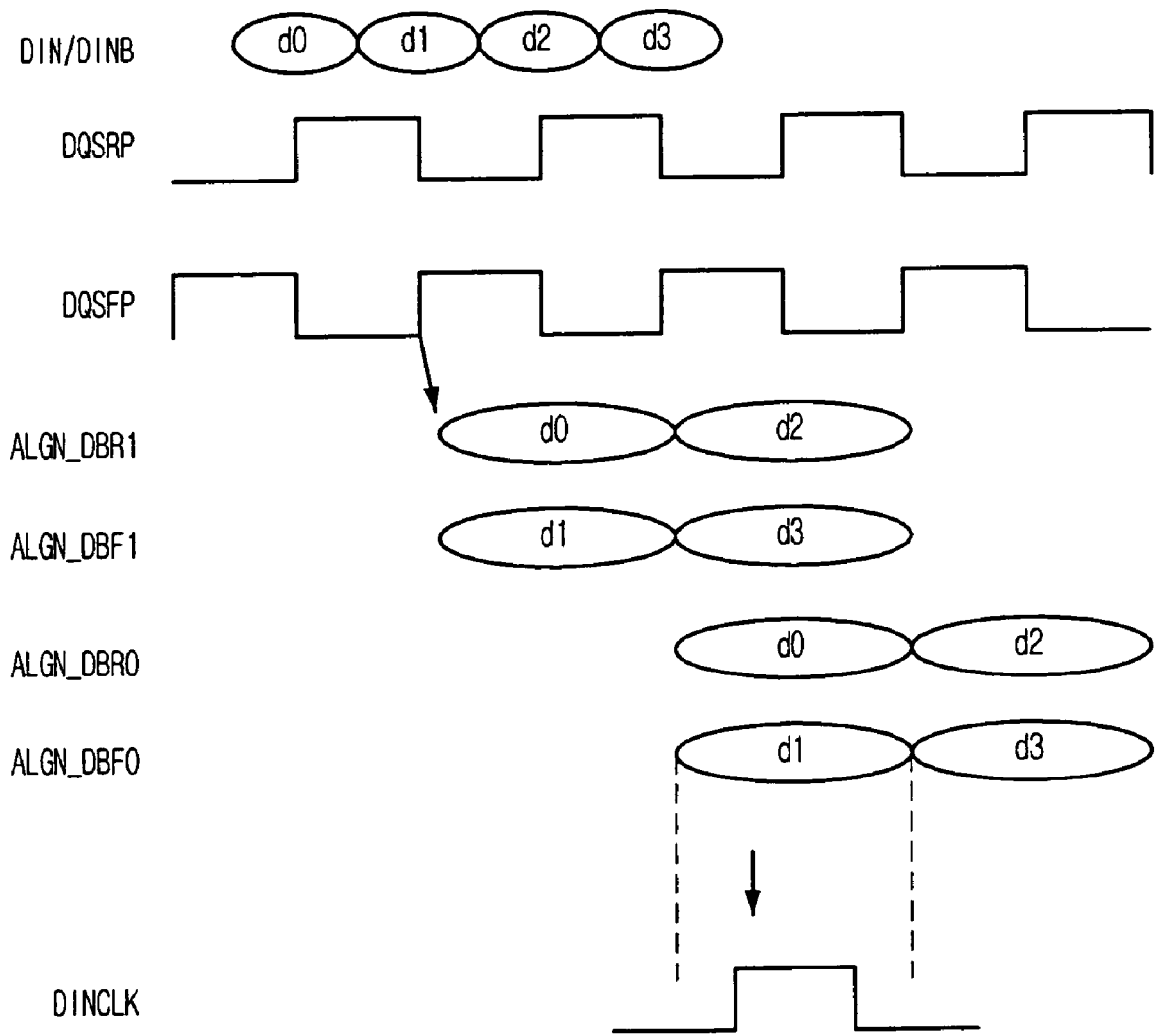
FIG. 3 is a wave diagram showing an operation of the conventional semiconductor memory device shown in FIG. 1.
Figure 4:
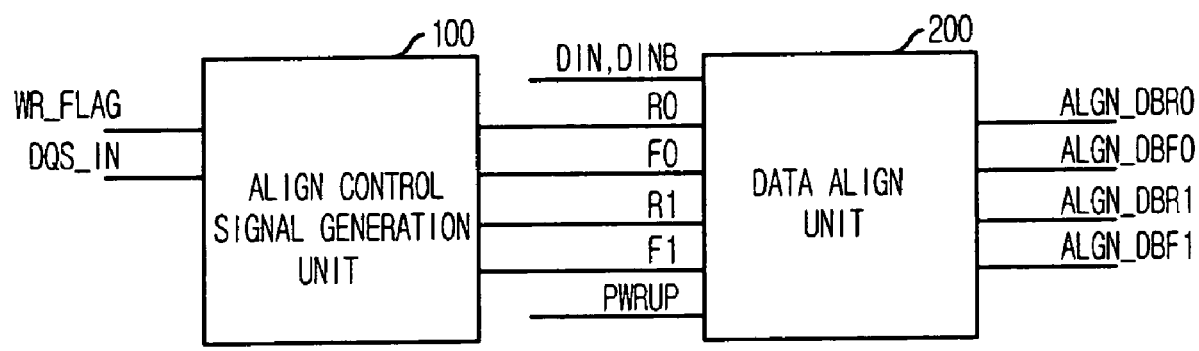
FIG. 4 is a block diagram showing a semiconductor memory device in accordance with a preferred embodiment of the present invention.

FIG. 4 is a block diagram showing a semiconductor memory device in accordance with a preferred embodiment of the present invention.

As shown, the semiconductor memory device includes an align control signal generation unit 100 and a data align unit 200.

The align control signal generation unit 100 generate a plurality of align control signals, i.e., a first to a fourth align control signals R0, F0, R1 and F1, only when a data is inputted, wherein a period of the align control signals R0, F0, R1 and F1 is double of that of a data strobe signal DQS_IN. The data align unit 200 receives a plurality of data and outputs the received data as a plurality of align data ALGN_DBR0, ALGN_DBF0, ALGN_DBR1 and ALGN_DBF1 at the same time in response to the first to the fourth align control signals R0 to F1.

Herein, the align control signal generation unit 100 determines whether or not the data is inputted according to a write flag signal WR_FLAG in order to generate the first to the fourth align control signals R0 to F1 by dividing a frequency of the data strobe signal DQS_IN by 2. Accordingly, since the data align unit 200 is operated by the first to the fourth align control signals R0 to F1 whose each frequency is double of that of the data strobe signal DQS_IN, a power consumption of the data align unit 200 is half of that of the conventional data align unit.

Meanwhile, the write flag signal WR_FLAG is an internal signal which is activated after a corresponding time of a write latency (WL=additive latency+CAS latency+1) is passed from an input timing of a write command. The data strobe signal DQS_IN which indicates an input/output of a data is generated by passing an externally inputted data strobe signal DQS through a buffer constituted with a differential amplifier.

Therefore, when there is no data input/output, the data strobe signal DQS_IN has a voltage level of a termination voltage Vtt. On the contrary, when the data input/output operation is performed, the strobe signal DQS_IN holds a preamble state for indicating a beginning of the data input/output operation for a predetermined time and, then, is formed as a pulse train. Then, the strobe signal DQS_IN holds a postamble state for indicating an end of the data input/output operation for a predetermined time when the data input/output operation is finished.

Herein, the termination voltage Vtt has a same voltage level with another input of the differential amplifier, i.e., a reference voltage. When the inputs of the differential amplifier have a voltage level of the termination voltage Vtt, the data strobe signal DQS_IN is not generated.

Figure 5:
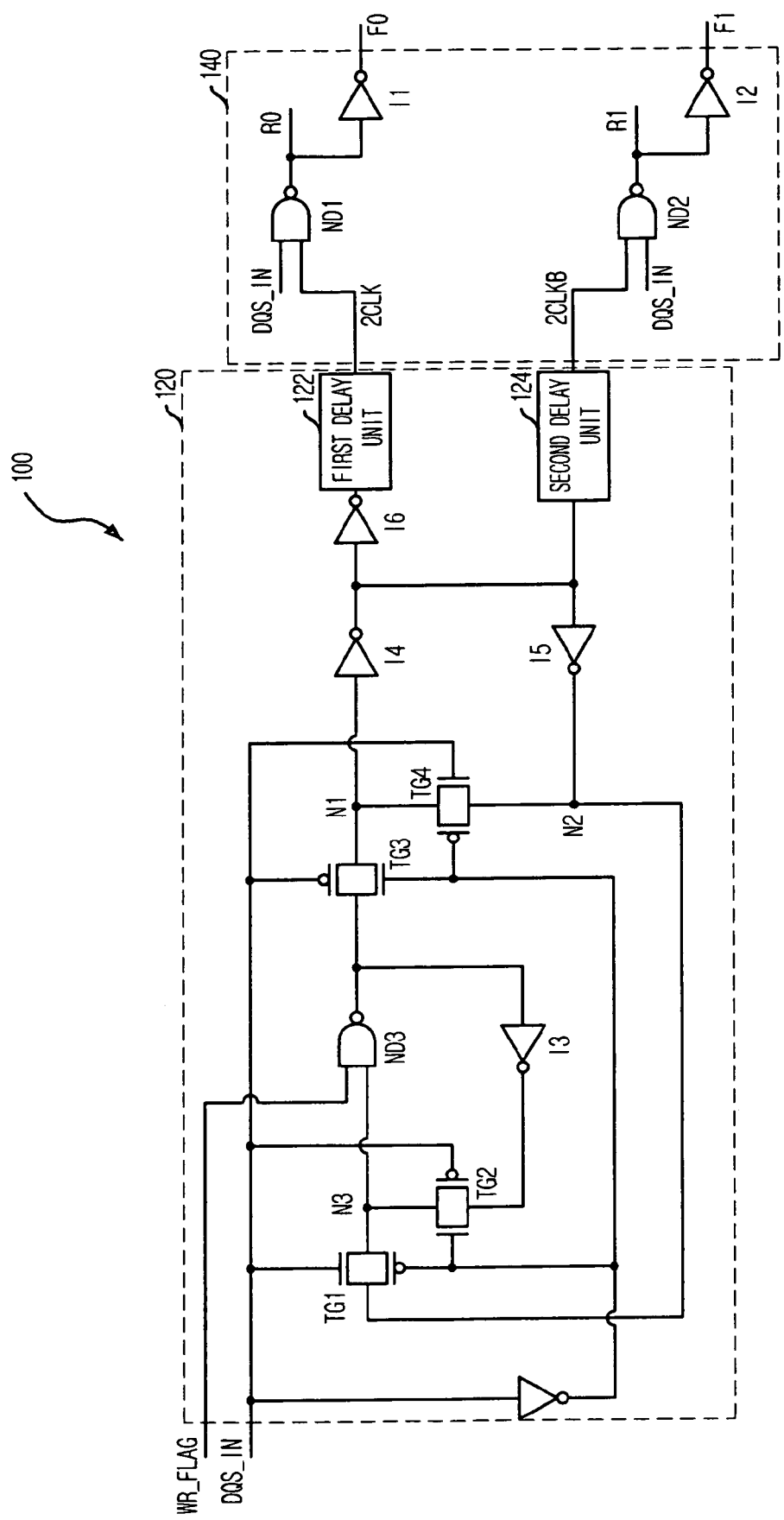
FIG. 5 is a schematic circuit diagram showing the align control signal generation unit shown in FIG. 4.

FIG. 5 is a schematic circuit diagram showing the align control signal generation unit 100 shown in FIG. 4.

As shown, the align control signal generation unit 100 includes a dividing unit 120 for dividing the data strobe signal DQS_IN by 2 in response to the write flag signal WR_FLAG; and an output unit 140 for outputting a main output 2CLK and a sub output 2CLKB of the dividing unit 120 as the first to the fourth align control signals R0 to F1 in synchronization with the data strobe signal DQS_IN.

In detail, the output unit 140 includes a first NAND gate ND1 for receiving the main output 2CLK and the data strobe signal DQS_IN in order to generate the first align control signal R0; a first inverter I1 for inverting the first align control signal R0 to thereby generate the second align control signal F0; a second NAND gate ND2 for receiving the sub output 2CLKB and the data strobe signal DQS_IN in order to generate the third align control signal R1; and a second inverter I2 for inverting the third align control signal R1 to thereby generate the fourth align control signal F1.

The dividing unit 120 includes a fourth transfer gate TG4 for transferring a voltage loaded on a first node N1 to a second node N2 in response to an activation of the data strobe signal DQS_IN; a first transfer gate TG1 for transferring a voltage loaded on the second node N2 to a third node N3 in response to an activation of the data strobe signal DQS_IN; a third NAND gate ND3 for receiving a voltage loaded on the third node N3 and the write flag signal WR_FLAG; a third inverter I3 for inverting an output of the third NAND gate ND3; a second transfer gate TG2 for transferring an output of the third inverter I3 to the third node N3 in response to an inactivation of the data strobe signal DQS_IN; a third transfer gate TG3 for transferring an output of the third NAND gate ND3 to the first node N1 in response to an inactivation of the data strobe signal DQS_IN; a fourth inverter I4 for inverting a voltage loaded on the first node N1; a fifth inverter I5 for inverting an output of the fourth inverter I4 to thereby output the inverted signal to the second node N2; a sixth inverter I6 for inverting an output of the fourth inverter I4; a first delay unit 122 for delaying an output of the sixth inverter I6 to thereby generate the main output 2CLK; and a second delay unit 124 for delaying an output of the fourth inverter I4 to thereby generate the sub output 2CLKB.

Therefore, the align control signal generation unit 100 generates signals whose period is double of a period of the data strobe signal by using the diving unit 120 and activates the outputs of the dividing unit 120 as the first to the fourth align control signals R0 to F1 synchronized with a rising edge and a falling edge of the data strobe signal DQS_IN by using the output unit 140. Therefore, activation timings of the first to the fourth align control signals R0 to F1 have a half of a period of the data strobe signal DQS_IN.

Meanwhile, the main output 2CLK and the sub output 2CLKB outputted from the dividing unit 120 should be initialized as a logic high level and a logic low level respectively before the write flag signal WR_FLAG is inputted. For securing the initialization of the dividing unit 120, the write flag signal WR_FLAG should be inputted after an activation of the data strobe signal DQS_IN.

An operation of the dividing unit 120 according to whether the data strobe signal DQS_IN is inputted before or after the preamble is described below.

Figure 6:
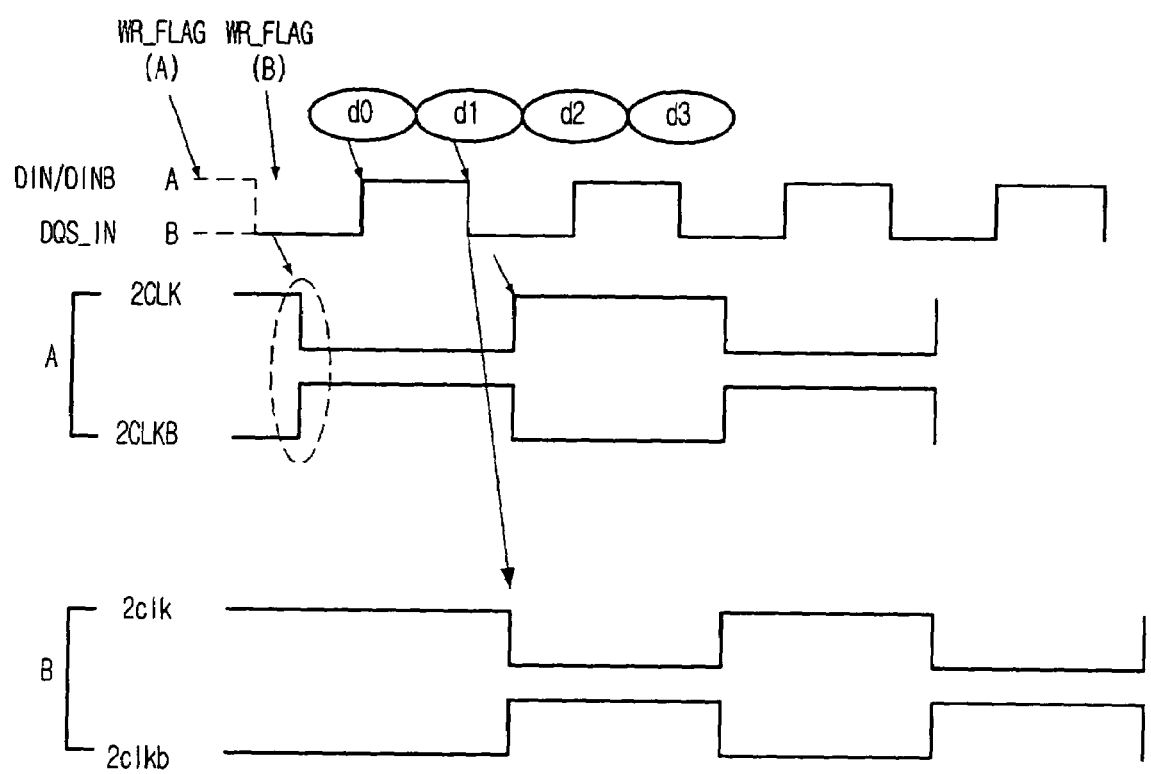
FIG. 6 is a wave diagram showing the operation of the diving unit shown in FIG. 4.

FIG. 6 is a wave diagram showing the operation of the diving unit 120 according to an input timing of the write flag signal WR_FLAG. Herein, the case 'A' shows the operation of the dividing unit 120 when the write flag signal WR_FLAG is inputted before the preamble of the data strobe signal DQS_IN and the case 'B' shows the operation of the dividing unit 120 when the write flag signal WR_FLAG is inputted after the preamble of the data strobe signal DQS_IN.

In case of the case 'A', since the main output 2CLK and the sub output 2CLKB are activated in synchronization with a falling edge of the data strobe signal DQS_IN according to the preamble of the data strobe signal DQS_IN, the main output 2CLK and the sub output 2CLKB are activated before an activation of the data strobe signal DQS_IN with which the data DIN and DINB are synchronized.

On the contrary, in case of the case 'B', the main output 2CLK and the sub output 2CLKB are activated in response to a falling edge of the data strobe signal DQS_IN with which the data DIN and DINB are synchronized.

Therefore, in case that the write flag signal WR_FLAG is inputted before the preamble of the data strobe signal DQS_IN, a stable operation of the diving unit 120 cannot be secured. That is, due to various environmental conditions, the termination voltage Vtt of the data strobe signal DQS_IN is higher than or lower than the reference voltage and, thus, a falling edge of the data strobe signal DQS_IN is generated. Accordingly, the main output 2CLK and the sub output 2CLKB are activated wrong by the falling edge of the data strobe signal DQS_IN.

Therefore, the write flag signal WR_FLAG should be inputted after the preamble of the data strobe signal DQS_IN.

Figure 7:
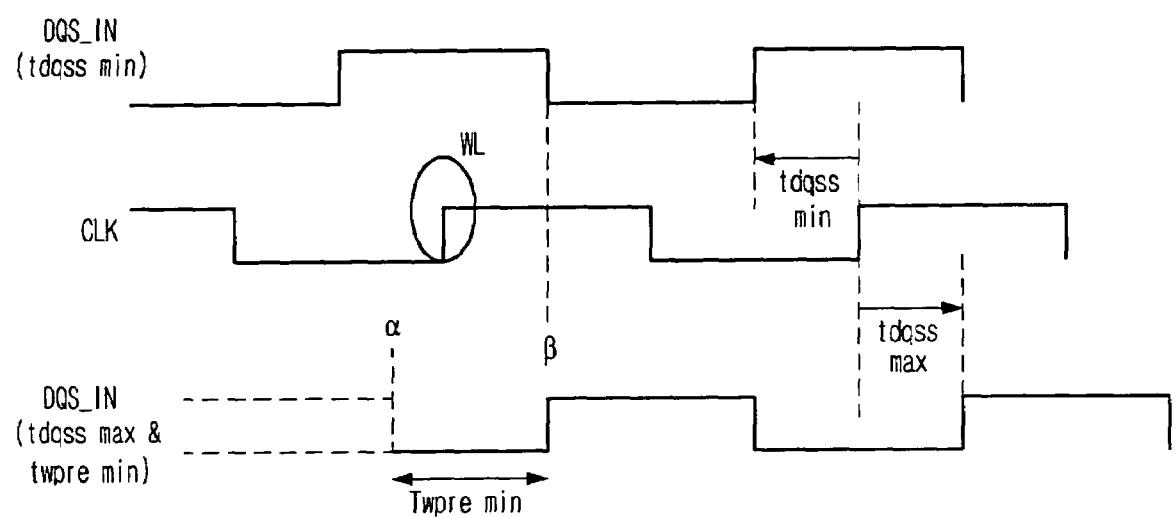
FIG. 7 is a wave diagram showing a valid window where a rising edge of a write flag signal should be located.

FIG. 7 is a wave diagram showing a valid window where a rising edge of the write flag signal WR_FLAG should be.

As shown, the write flag signal WR_FLAG should be located between the timing 'α' and the timing 'β' in synchronization with a rising edge of an internal clock CLK after the corresponding time of the write latency (WL) is passed from the input timing of the write command.

Since the timing 'α' has a value of −twpre_min+tdqss_max having the rising edge of the internal clock CLK as a reference point, the timing 'α' has a value of −0.1 tCK (clock cycle). Since the timing 'β' has a value of 0.5 tCK-tdqss_min (0.25 tCK), the timing 'β' has a value of 0.25 tCK. Therefore, the write flag signal WR_FLAG synchronized with the rising edge of the internal clock CLK, the rising edge corresponding to the write latency (WL), is within 0.35 tCK, i.e., a timing difference between the timing 'α' and the timing 'β'.

Figure 8:
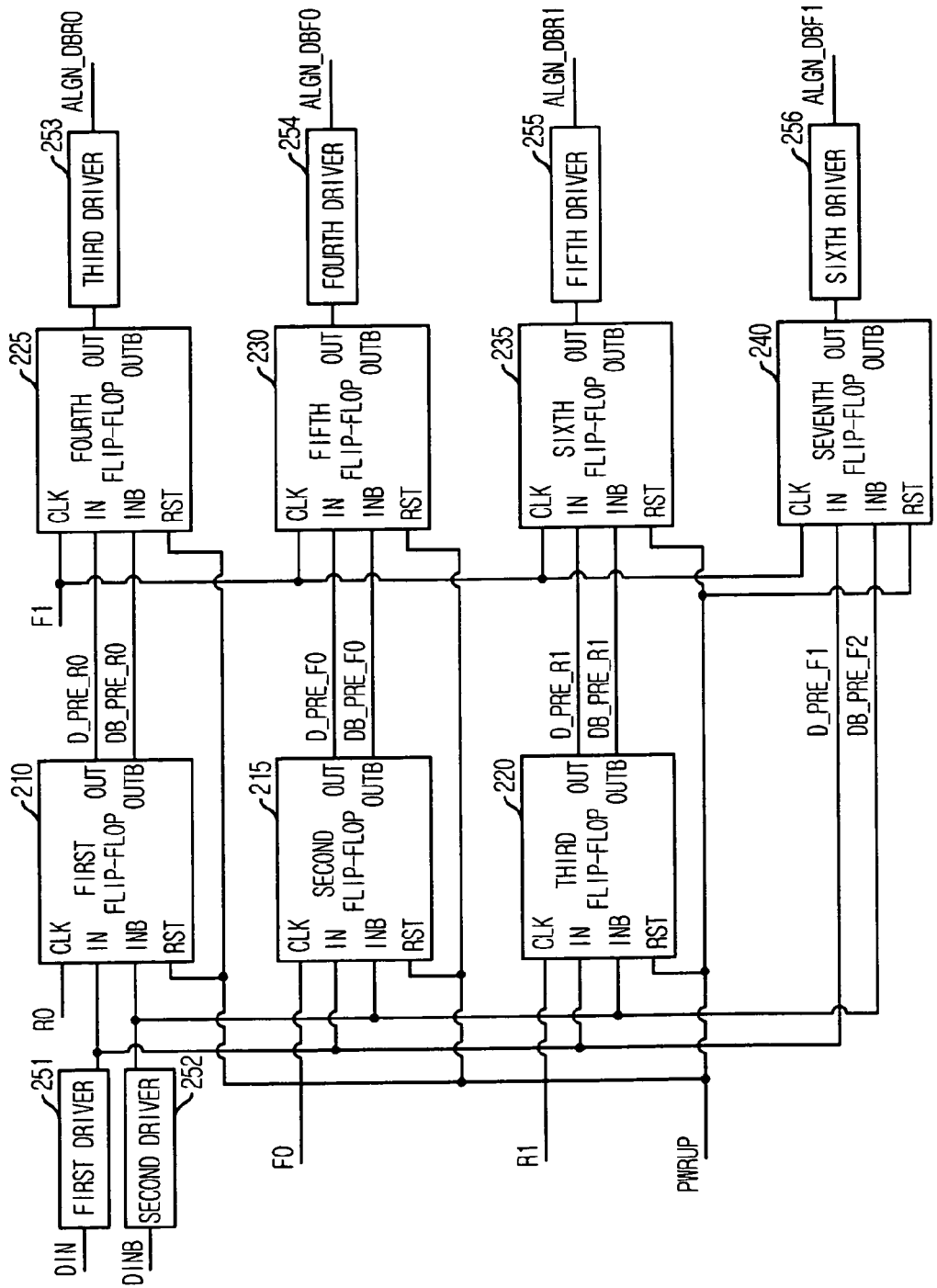
FIG. 8 is a block diagram showing the data align unit shown in FIG. 4.

FIG. 8 is a block diagram showing the data align unit 200 shown in FIG. 4.

As shown, the data align unit 200 includes a first to a sixth drivers 251 to 256 and a first to a seventh flip-flops 210 to 240.

The first and the second drivers 251 and 252 respectively drive the data DIN and the inverted data DINB. The first flip-flop 210 receives outputs of the first and the second drivers 251 and 252 in order to respectively output the received signals as a main output D_PRE_R0 and a sub output DB_PRE_R0 in response to the first align control signal R0. The second flip-flop 215 receives the outputs of the first and the second drivers 251 and 252 in order to respectively output the received signals as a main output D_PRE_F0 and a sub output DB_PRE_F0 in response to the second align control signal F0. The third flip-flop 220 receives the outputs of the first and the second drivers 251 and 252 in order to respectively output the received signals as a main output D_PRE_R1 and a sub output DB_PRE_R1 in response to the third align control signal R1.

The fourth to sixth flip-flops 225 to 240 receive each main output and sub output of the first to the third flip-flops 210 to 220 respectively in response to the fourth align control signal F1. The seventh flip-flop 240 receives the outputs of the first and the second drivers 251 and 252 in response to the fourth align control signal F1.

The third to the sixth drivers 253 to 256 receive each main output OUT of the fourth to the seventh flip-flops 225 to 240 respectively in order to output a first a fourth align data ALGN_DBR0, ALGN_DBF0, ALGN_DBR1 and ALGN_DBF1.

As described above, the first to the seventh flops 210 to 240 are arranged in a form of a 4-row parallel connection and a 2-column series connection. Therefore, in comparison with the prior art, the number of operations is decreased by half and, thus, a power consumption is reduced.

Figure 9:
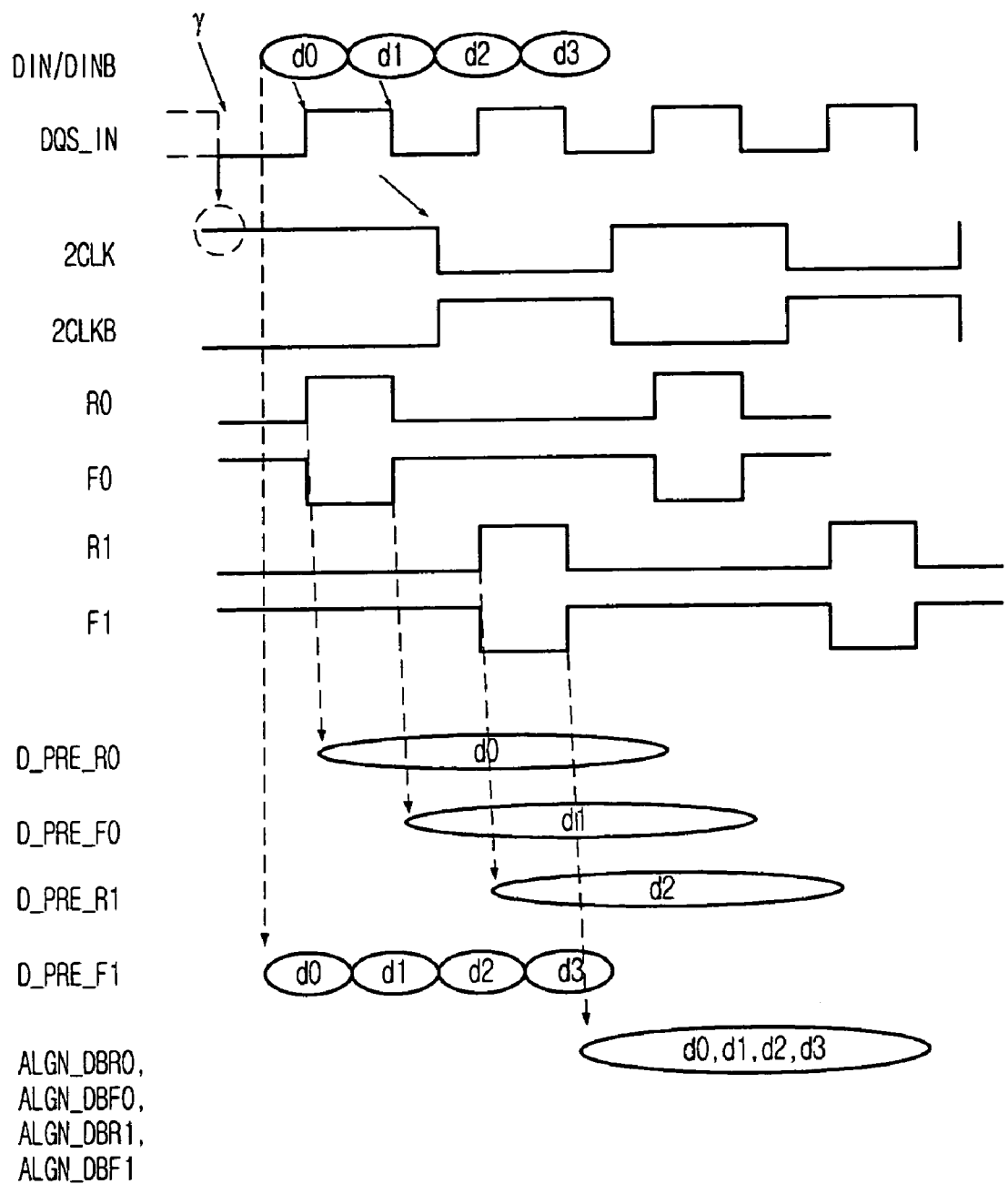
FIG. 9 is a wave diagram showing an operation of the semiconductor memory device shown in FIG. 4.

FIG. 9 is a wave diagram showing an operation of the semiconductor memory device shown in FIG. 4.

Referring to FIGS. 4 to 9, the data aligning process for synchronously outputting inputted data which are sequentially inputted is described below.

The dividing unit 120 generates the main output 2CLK and the sub output 2CLKB which is an inverted version of the main output 2CLK by dividing the data strobe signal DQS_IN by 2 when the write flag signal WR_FLAG is activated. The output unit 140 outputs the first and the second align control signals R0 and F0 when both the main output 2CLK and the data strobe signal DQS_IN are activated. When both the sub output 2CLKB and the data strobe signal DQS_IN are activated, the output unit 140 outputs the third and the fourth align control signals R1 and F1.

As above-mentioned, the output unit 140 generates the first align control signal R0 by synchronizing the main output 2CLK with the data strobe signal DQS_IN, wherein a period of the main output 2CLK is double of that of the data strobe signal DQS_IN. The second align control signal F0 is generated by inverting the first align control signal R0. Therefore, the first align control signal R0 is activated at a rising edge of the data strobe signal DQS_IN, and the second align control signal F0 is activated in synchronization with a falling edge of the data strobe signal DQS_IN with which the first align control signal R0 is synchronized.

The output unit 140 generates the third align control signal R1 by synchronizing the sub output 2CLKB with the data strobe signal DQS_IN. Therefore, the third align control signal R1 is activated in synchronization with a next rising edge of the data strobe signal DQS_IN after the rising edge of the data strobe signal DQS_IN with which the first align control signal R0 is synchronized. The fourth align control signal F1 is activated in synchronized with a falling edge of the data strobe signal DQS_IN with which the third align control signal F1 is synchronized.

Accordingly, the data align unit 200 inputs a first data d0, a second data d1 and a third data d2 to the first to the third flip-flops 210 to 220 respectively in response to the sequentially activated first to third align control signals R0 to R1, wherein the first to the third data d0 to d2 are inputted in synchronization with a rising edge and a falling edge of the data strobe signal DQS_IN. As shown in FIG. 9, main outputs of the first to the third flip-flops 210 to 220, i.e., D_PRE_R0, D_PRE_F0 and D_PRE_R1, are synchronized with the first to the third align control signals R0 to R1 respectively.

Thereafter, in response to an activation of the fourth align control signal F1, the fourth to the sixth flip-flops 225 to 235 output the each stored data in the first to the third flip-flops 210 to 220 as the first to the third align data ALGN_DBR0 to ALGN_DBR1 respectively, and the seventh flip-flop 240 outputs a fourth data d3 as the fourth align data ALGN_DBF1.

That is, the align unit 200 aligns the first to the fourth data d0 to d3 which are sequentially inputted in synchronization with a rising edge or a falling edge of the data strobe signal DQS_IN in order to output the aligned data, i.e., the first to the fourth align data ALGN_DBR0 to ALGN_DBF1, at the same time.

Meanwhile, the write flag signal WR_FLAG is inputted at the timing 'γ' and the timing 'γ' is after the preamble state of the data strobe signal DQS_IN.

As a result, in accordance with the preferred embodiment of the present invention, since a period of the data strobe signal is increased by two times and the data strobe signal having the double period is used for flip-flops which receive data, the number of operations of the flip-flops can be decreased by half in comparison with the prior art. Accordingly, a power consumption is also reduced by half. For instance, in case of a double data rate 2 synchronous dynamic random access memory (DDR2 SDRAM) based on a 10 μm-technology and 400 MHz of a data rate, the DDR2 SDRAM consumes a current of 8 mA for receiving 16-bit data.

Further, since the period of the data strobe signal is increased by two times, a maintaining time of the aligned data is increased to 2 clocks. That is, a valid data window is increased to 2 clocks and, thus, a greater margin can be secured.

Meanwhile, although it is assumed that 4-bit data is fetched at the same time for the preferred embodiment of the present invention, the bit number can be changed.

The present application contains subject matter related to Korean patent application No. 2005-0036584, filed in the Korean Patent Office on Apr. 30, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device, comprising: an align control signal generation unit for generating a plurality of align control signals sequentially activated by dividing a data strobe signal only when a data input/output is performed; and a data align unit for outputting a plurality of data which are sequentially inputted as a plurality of align data, at the same time in response to the plurality of align control signals, wherein the align control signal generation unit includes:
a dividing unit for dividing the data strobe signal by 2 in response to an activation of a write flag signal; and
an output unit for generating a plurality of align control signals by synchronizing a main output and a sub output of the dividing unit with the data strobe signal, said plurality of align control signals including first to fourth align control signals which are activated in synchronization with a rising edge and a falling edge of the data strobe signal inputted after an activation of the write flag signal.

2. The semiconductor memory device as recited in claim 1, wherein the align control signal generation unit generates the plurality of align control signals by dividing a frequency of the data strobe signal by 2 after determining whether or not a data is inputted according to the write flag signal.

3. The semiconductor memory device as recited in claim 1, wherein the output unit includes: a first NAND gate for receiving the main output of the dividing unit and the data strobe signal in order to generate the first align control signal; a first inverter for inverting the first align control signal in order to generate the second align control signal; a second NAND gate for receiving the sub output of the dividing unit and the data strobe signal in order to generate the third align control signal; and a second inverter for inverting the third align control signal in order to generate the fourth align control signal.

4. The semiconductor memory device as recited in claim 3, wherein the dividing unit includes: a first transfer gate for transferring a voltage loaded on a first node to a second node in response to an activation of the data strobe signal; a second transfer gate for transferring a voltage loaded on the second node to a third node in response to an activation of the data strobe signal; a third NAND gate for receiving a voltage loaded on the third node and the write flag signal; a third inverter for inverting an output of the third NAND gate; a third transfer gate for transferring an output of the third inverter to the third node in response to an inactivation of the data strobe signal; a fourth transfer gate for transferring an output of the third NAND gate to the first node in response to an inactivation of the data strobe signal; a fourth inverter for inverting a voltage loaded on the first node; a fifth inverter for inverting an output of the fourth inverter to thereby output the inverted signal to the second node; a sixth inverter for inverting an output of the fourth inverter; a first delay unit for delaying an output of the sixth inverter to thereby generate the main output; and a second delay unit for delaying an output of the fourth inverter to thereby generate the sub output.

5. The semiconductor memory device as recited in claim 4, wherein the main output and the sub output of the dividing unit are initialized as a logic high level and a logic low level respectively before an activation of the write flag signal.

6. The semiconductor memory device as recited in claim 5, wherein the data align unit includes: a first and a second drivers for providing a data and an inverted data; a first flip-flop for receiving the outputs of the first and the second drivers in order to output a main output and a sub output in response to the first align control signal; a second flip-flop for receiving the outputs of the first and the second drivers in order to output a main output and a sub output in response to the second align control signal; a third flip-flop for receiving the outputs of the first and the second drivers in order to output a main output and a sub output in response to the third align control signal; a fourth to a sixth flip-flops for receiving each main output and sub output of the first to the third flip-flops respectively in response to the fourth align control signal; a seventh flip-flop for receiving the outputs of the first and the second drivers in order to output a main output and a sub output in response to the fourth align control signal; and a third to a sixth drivers for outputting main outputs of the fourth to the seven flip-flops as the first to the fourth align data respectively.

* * * * *